(12) United States Patent
Iwasaki

(10) Patent No.: US 8,111,982 B2
(45) Date of Patent: Feb. 7, 2012

(54) IMAGING DEVICE AND ELECTRONIC CAMERA

(75) Inventor: Yoichi Iwasaki, Saitama (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 12/893,751

(22) Filed: Sep. 29, 2010

(65) Prior Publication Data

US 2011/0076001 A1     Mar. 31, 2011

(30) Foreign Application Priority Data

Sep. 30, 2009   (JP) ................................ 2009-227338

(51) Int. Cl.
  *G03B 7/099*  (2006.01)
  *G02B 7/28*   (2006.01)
  *H04N 5/225*  (2006.01)
(52) U.S. Cl. ....................... 396/113; 348/340
(58) Field of Classification Search .......... 396/113–114; 348/335, 340
  See application file for complete search history.

(56) References Cited

U.S. PATENT DOCUMENTS

| 4,575,626 | A | 3/1986 | Oinoue et al. |
| 6,583,433 | B2 * | 6/2003 | Sugiyama et al. ............ 396/114 |
| 6,781,632 | B1 | 8/2004 | Ide |
| 7,847,852 | B2 * | 12/2010 | Kuriyama ..................... 348/335 |
| 2010/0177205 | A1 * | 7/2010 | Shimoda et al. ........... 348/222.1 |
| 2011/0085785 | A1 * | 4/2011 | Ishii .............................. 396/104 |
| 2011/0221947 | A1 * | 9/2011 | Awazu .......................... 348/311 |

FOREIGN PATENT DOCUMENTS

| JP | 59-15208 | A | | 1/1984 |
| JP | 10-229180 | | * | 8/1998 |
| JP | 2959142 | B2 | | 10/1999 |
| JP | 2005-303409 | A | | 10/2005 |
| JP | 4007716 | B2 | | 11/2007 |
| JP | 2008-71920 | A | | 3/2008 |

* cited by examiner

*Primary Examiner* — Chrisotpher Mahoney
(74) *Attorney, Agent, or Firm* — Birch, Stewart, Kolasch & Birch, LLP

(57) ABSTRACT

An imaging device includes an arrayed imaging element group configured to receive light passing through a photographic lens, wherein the imaging element group includes a plurality of photographic elements used for photographic image data generation and a plurality of phase difference detection elements used for phase difference detection for focus detection of the photographic lens, each of the photographic elements and each of the phase difference detection elements include: an on-chip microlens configured to collect light passing through the photographic lens; a photoelectric conversion element configured to receive the light passing through the on-chip microlens; and an internal microlens disposed between the on-chip microlens and the photoelectric conversion element, the photographic element is configured such that an optical axis of the on-chip microlens matches an optical axis of the internal microlens, and the phase difference detection element is configured such that the optical axis of the on-chip microlens is shifted from the optical axis of the internal microlens.

18 Claims, 13 Drawing Sheets

IMAGING DEVICE AND ELECTRONIC CAMERA

BACKGROUND OF THE INVENTION

1. Field of the Invention

The presently disclosed subject matter relates to an imaging device having an imaging element group used for photographic image data generation and an imaging element group used for phase difference detection; and an electronic camera having the imaging device.

2. Description of the Related Art

There has been known an imaging device having a plurality of imaging elements (photographic elements) used for photographic image data generation and a plurality of imaging elements (phase difference detection elements) used for phase difference detection. Each imaging element of this imaging device includes a photoelectric conversion element (pixel). Moreover, a phase difference detection element group includes a first element group performing photoelectric conversion on object light passing through one partial region of an exit pupil of a photographic lens; and a second element group performing photoelectric conversion on object light passing through the other partial region of the exit pupil of the photographic lens. A defocus amount of the photographic lens can be detected by detecting a phase difference between pixel information obtained by the first element group and pixel information obtained by the second element group.

Japanese Patent Application Laid-Open No. 2005-303409, Japanese Patent No. 2959142, and Japanese Patent Application Laid-Open No. 59-15208 disclose a structure in which a microlens is disposed shifted from a photoelectric conversion element.

Japanese Patent Application Laid-Open No. 2008-71920 discloses a structure in which a microlens is disposed for a plurality of photoelectric conversion elements.

SUMMARY OF THE INVENTION

An arrayed configuration in which a plurality of photographic elements and a plurality of phase difference detection elements are disposed on a light receiving surface can eliminate the need to use an optical path dividing mechanism and a distance measuring sensor and thus achieve low costs and space saving as well as high-speed focus detection. However, further microfabrication reduces the amount of light incident on a photoelectric conversion element. In particular, the phase difference detection element group performs photoelectric conversion on object light passing through a partial region of the exit pupil of the photographic lens, and thus a reduction in incident light causes a remarkable reduction in focus detection precision.

Note that as disclosed in Japanese Patent Application Laid-Open No. 2008-71920, when a microlens is disposed for a plurality of photoelectric conversion elements for phase difference detection, the focal length of the microlens increases and thus it is difficult to dispose the photoelectric conversion elements for phase difference detection and the photoelectric conversion element for photographing on the same plane. Moreover, when the photoelectric conversion elements for a microlens are divided into one for phase difference detection and one for photographing, further microfabrication makes it difficult to form an opening thereof in such a manner that one for guiding light into the photoelectric conversion element for phase difference detection is smaller than one for the photoelectric conversion element for photographing. Moreover, the amount of light incident on a photoelectric conversion element is reduced remarkably.

Further, if an internal structure is made differently between the photographic element and the phase difference detection element, it is difficult to reuse the internal structure for ordinary imaging device, causing another problem with an increase in manufacturing cost in the entire business. Furthermore, the photoelectric conversion element (pixel) for phase difference detection is subject to a restriction in a light receiving direction and thus it is difficult to use the pixel information to generate high-quality photographic image data. Still furthermore, when phase difference detection elements are disposed at high density in order to ensure focus detection precision at low intensity, the photographic image quality deteriorates. Thus, what is needed is to achieve a good balance between an improvement in image quality of photographic image data and an improvement in focus detection precision.

In view of such circumstances, the presently disclosed subject matter has been made, and an object of the presently disclosed subject matter is to provide an imaging device and an electronic camera which can achieve low costs, space saving, and high-speed focus detection as well as accurate focus detection even with microfabrication.

In order to achieve the above object, the presently disclosed subject matter provides an imaging device having an arrayed imaging element group which receives light passing through a photographic lens, wherein the imaging element group includes a plurality of photographic elements used for photographic image data generation and a plurality of phase difference detection elements used for phase difference detection for focus detection of the photographic lens, each of the photographic elements and each of the phase difference detection elements include: an on-chip microlens which collects light passing through the photographic lens; a photoelectric conversion element which receives the light passing through the on-chip microlens; and an internal microlens which is disposed between the on-chip microlens and the photoelectric conversion element, the photographic element is configured such that an optical axis of the on-chip microlens matches an optical axis of the internal microlens, and the phase difference detection element is configured such that the optical axis of the on-chip microlens is shifted from the optical axis of the internal microlens.

Briefly, an imaging element includes an on-chip microlens, an internal microlens and a photoelectric conversion element as well as a phase difference detection element is configured such that an optical axis of the on-chip microlens is shifted from the optical axis of the internal microlens. This configuration can efficiently introduce light passing through a partial region of an exit pupil of the photographic lens into the photoelectric conversion element in comparison with a configuration in which the on-chip microlens is only shifted from the photoelectric conversion element without providing an internal microlens. Thus, the presently disclosed subject matter can achieve low costs, space saving, and high-speed focus detection as well as accurate focus detection even with microfabrication.

According to an aspect of the presently disclosed subject matter, both the photographic element and the phase difference detection element are configured such that the optical axis of the internal microlens matches the optical axis of the photoelectric conversion element.

Briefly, both the photographic element and the phase difference detection element are configured such that the optical axis of the internal microlens matches the optical axis of the photoelectric conversion element. Thus, a base side laminated structure (chip) including an internal microlens and a photoelectric conversion element can be shared with an ordinary imaging device.

Moreover, the presently disclosed subject matter provides an imaging device having an arrayed imaging element group which receives light passing through a photographic lens, wherein the imaging element group includes a plurality of photographic elements used for photographic image data generation and a plurality of phase difference detection elements used for phase difference detection for focus detection of the photographic lens, each of the photographic elements and each of the phase difference detection elements include: an on-chip microlens which collects light passing through the photographic lens; a photoelectric conversion element which receives the light passing through the on-chip microlens; and an internal microlens which is disposed between the on-chip microlens and the photoelectric conversion element and has an entrance lens on an upstream side of an optical path and an exit lens on a downstream side of the optical path, the photographic element is configured such that an optical axis of the entrance lens of the internal microlens matches an optical axis of the exit lens, and the phase difference detection element is configured such that the optical axis of the entrance lens of the internal microlens is shifted from the optical axis of the exit lens.

Briefly, an imaging element includes an on-chip microlens, an internal microlens and a photoelectric conversion element as well as a phase difference detection element is configured such that the optical axis of the entrance lens of the internal microlens is shifted from the optical axis of the exit lens. This configuration can efficiently introduce light passing through a partial region of an exit pupil of the photographic lens into the photoelectric conversion element in comparison with a configuration in which the on-chip microlens is only shifted from the photoelectric conversion element without providing an internal microlens. Thus, the presently disclosed subject matter can achieve low costs, space saving, and high-speed focus detection as well as accurate focus detection even with microfabrication.

According to an aspect of the presently disclosed subject matter, both the photographic element and the phase difference detection element are configured such that the optical axis of the exit lens of the internal microlens matches the optical axis of the photoelectric conversion element.

Briefly, both the photographic element and the phase difference detection element are configured such that the optical axis of the exit lens of the internal microlens matches the optical axis of the photoelectric conversion element. Therefore, an electrode arrangement for reading pixel information can be shared between the photographic element and the phase difference detection element. Thus, further microfabrication is enabled.

According to an aspect of the presently disclosed subject matter, the photoelectric conversion element of the phase difference detection element has the same shape as that of the photoelectric conversion element of the photographic element.

According to an aspect of the presently disclosed subject matter, the on-chip microlens of the phase difference detection element has a smaller diameter than the diameter of the on-chip microlens of the photographic element.

Briefly, this configuration can prevent the on-chip microlens of the phase difference detection element from interfering with the on-chip microlens of the photographic element.

According to an aspect of the presently disclosed subject matter, a light shielding unit is provided around the on-chip microlens of the phase difference detection element.

Thus, the configuration can prevent unnecessary light from entering the photoelectric conversion element.

An aspect of the presently disclosed subject matter provides a first and a second of the phase difference detection elements which generate pixel information corresponding to light passing through mutually different partial regions of the exit pupil of the photographic lens, wherein a mutually adjacent pair of elements including the first and the second of the phase difference detection elements is arranged in an array pattern. Moreover, according to an aspect of the presently disclosed subject matter, three or more of the photographic elements having a color filter of the same color are arranged adjacent to each of the phase difference detection elements. Further, an aspect of the presently disclosed subject matter provides an image data generation device which generates photographic image data based on pixel information read from the photographic element, namely, an image data generation device which generates the photographic image data by interpolation based on pixel information read from the photographic elements having a color filter of the same color are arranged adjacent to each of the phase difference detection elements.

Thus, an adjacent arrangement of the first and second phase difference detection elements increases the correlation of pixel information for phase difference detection and improves focus detection precision. Further, high-quality photographic image data is generated by interpolating the pixel information for photographic image data generation in each pixel position for phase difference detection based on photographic pixel information of three or more photographic elements adjacent to each of the phase difference detection elements.

An aspect of the presently disclosed subject matter provides a first and a second of the phase difference detection elements which generate pixel information corresponding to light passing through mutually different partial regions of the exit pupil of the photographic lens, wherein a mutually adjacent pair of elements including the first and the second of the phase difference detection elements is arranged in a staggered pattern.

Thus, an adjacent arrangement of the first and second phase difference detection elements and a staggered arrangement thereof improve focus detection precision.

An aspect of the presently disclosed subject matter provides a first and a second of the phase difference detection elements which generate pixel information corresponding to light passing through mutually different partial regions of the exit pupil of the photographic lens, wherein a first element pair including a mutually adjacent pair of the first phase difference detection elements and a second element pair including a mutually adjacent pair of the second phase difference detection elements are arranged in an array pattern.

Thus, focus detection precision at low intensity can be ensured by performing pixel information synthesis (pixel mixing) on a mutually adjacent pair of first phase difference detection elements as well as by performing pixel information synthesis (pixel mixing) on a mutually adjacent pair of second phase difference detection elements.

An aspect of the presently disclosed subject matter provides a first and a second of the phase difference detection elements which generate pixel information corresponding to light passing through mutually different partial regions of the exit pupil of the photographic lens, wherein a mutually adjacent element pair including the first and second phase difference detection elements is arranged in an array pattern along a first direction for phase difference detection and along a second direction for synthesizing the pixel information, and an arrangement pitch of the element pair in the first direction is equal to or less than arrangement pitch of the element pair in the second direction. Further, an aspect of the presently disclosed subject matter provides a focus detection device which synthesizes pixel information of the photoelectric conversion element between a plurality of the first phase difference detection elements arranged along the second direction as well as synthesizes pixel information of the photoelectric conversion element between a plurality of the second phase difference detection elements arranged along the second direction, and performs focus detection of the photographic lens based on the synthesized pixel information.

Thus, focus detection precision can be ensured by increasing the density of the phase difference detection elements in the first direction for phase difference detection as well as focus detection precision can be ensured by pixel information synthesis (pixel mixing) in the second direction even with a reduced density of the phase difference detection elements.

Thus, the presently disclosed subject matter can achieve low costs, space saving, and high-speed focus detection as well as accurate focus detection even with microfabrication.

DETAILED DESCRIPTION OF THE PREFERRED EMBODIMENTS

Hereinafter, by referring to the accompanying drawings, embodiments of the presently disclosed subject matter will be described in detail.

Figure 1:
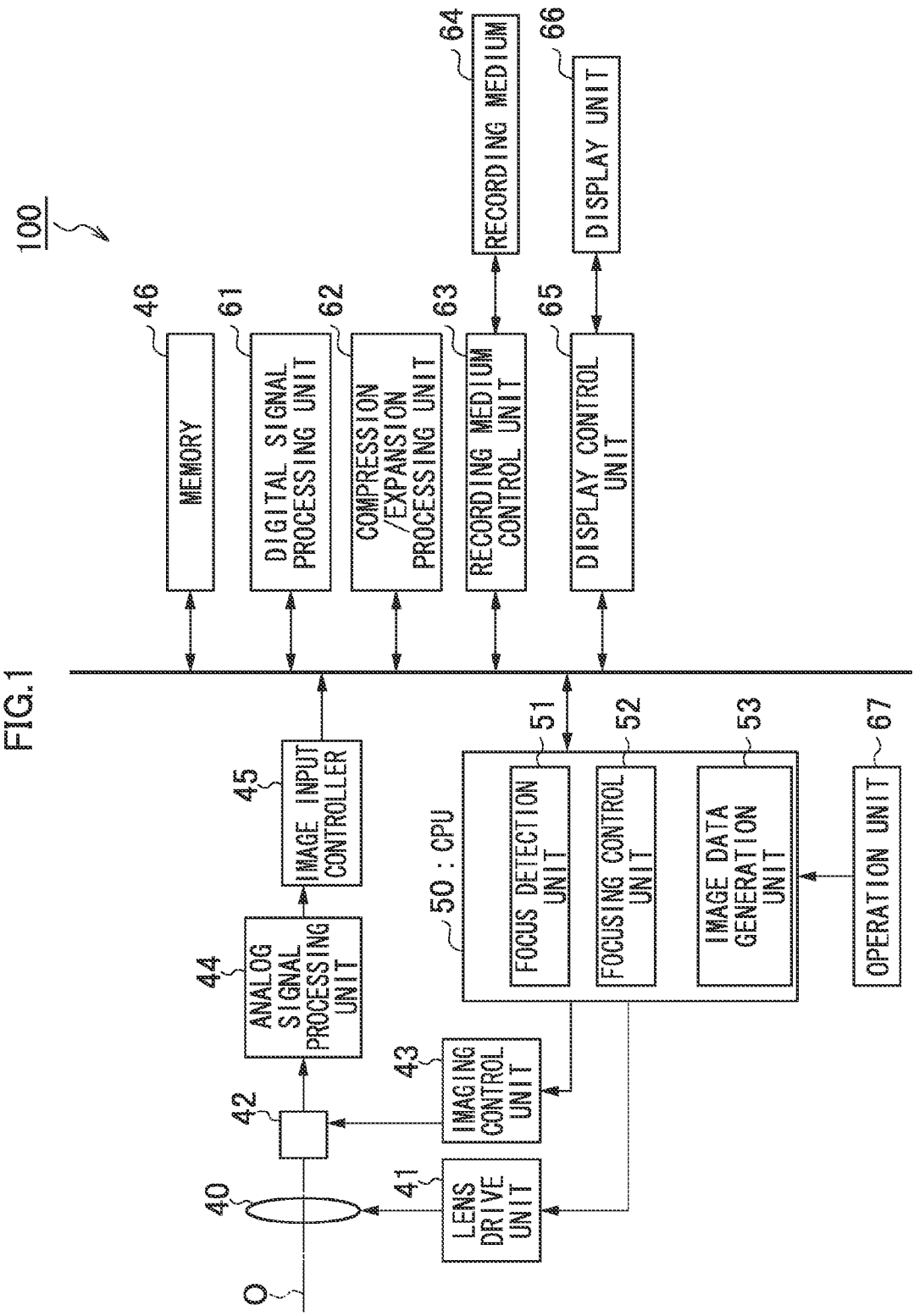
FIG. 1 is a block diagram illustrating a schematic configuration of an example of a digital camera according to the presently disclosed subject matter.

FIG. 1 is a block diagram illustrating a schematic configuration of an example of a digital camera according to the presently disclosed subject matter.

In FIG. 1, a digital camera 100 according to the present embodiment includes: a photographic lens 40, a lens drive unit 41, an imaging unit 42, an imaging control unit 43, an analog signal processing unit 44, an image input controller 45, a memory 46, a CPU (central processing unit) 50, a digital signal processing unit 61, a compression/expansion processing unit 62, a recording medium control unit 63, a recording medium 64, a display control unit 65, a display unit 66, and an operation unit 67.

The photographic lens 40 includes a zoom lens and a focus lens. The lens drive unit 41 moves a lens constituting the photographic lens 40 in a direction of an optical axis O.

The imaging unit 42 takes an image by receiving object light passing through the photographic lens 40. The imaging unit 42 according to the present embodiment is configured of a CCD (Charge Coupled Device) imaging device and includes an imaging element used for photographic image data generation (hereinafter also referred to as a "photographic element") and an imaging element used for phase difference detection for focus detection of the photographic lens 40 (hereinafter also referred to as a "phase difference detection element"). Specific examples of the photographic element and the phase difference detection element will be described in detail later.

The imaging control unit 43 controls charge accumulation in the photographic element and the phase difference detection element and controls reading pixel information from the photographic element and the phase difference detection element.

The analog signal processing unit 44 performs various analog signal processing (noise removal, amplification, etc.) on a pixel signal (pixel information) outputted from the imaging unit 42. The analog signal processing unit 44 has an A/D converter which converts a pixel signal from analog to digital.

The image input controller 45 stores a digital pixel signal outputted from the analog signal processing unit 44 in the memory 46.

The CPU (Central Processing Unit) 50 controls each unit of the digital camera 100 by executing a predetermined program.

The digital signal processing unit 61 performs various digital signal processing (e.g., tone characteristics processing, sharpness processing, white balance adjustment, YC signal generation, etc.) on pixel information stored in the memory 46 in response to an instruction from the CPU 50.

The compression/expansion processing unit 62 compresses various data and expands various data in response to an instruction from the CPU 50.

The recording medium control unit 63 controls recording various data in the recording medium 64 and acquiring various data from the recording medium 64 in response to an instruction from the CPU 50. The recording medium 64 is not particularly limited, but, for example, a memory card attachable to and detachable from the main body of the digital camera 100 is used.

The display control unit 65 controls displaying on the display unit 66 in response to an instruction from the CPU 50. The display unit 66 is a device capable of displaying an image, and for example, includes a liquid crystal display.

The operation unit 67 is an instruction input device through which the user inputs various instructions to the digital camera 100. For example, the operation unit 67 includes a shutter button and a mode switching switch.

The CPU 50 according to the present embodiment includes a focus detection unit 51, a focusing control unit 52, and an image data generation unit 53.

The focus detection unit 51 performs focus detection by a phase difference detection method based on pixel information read from a phase difference detection element of the imaging unit 42. The focus detection method may be the same method disclosed in Japanese Patent No. 4007716 or Japanese Patent Application Laid-Open No. 59-15208.

The focusing control unit 52 performs focusing based on a focus detection result of the focus detection unit 51. More specifically, the focusing control unit 52 causes the lens drive unit 41 to move a focus lens constituting the photographic lens 40 to a focusing lens position in which the object is focused as needed.

The image data generation unit 53 generates photographic image data based on pixel information read from a photographic element of the imaging unit 42. The generated photographic image data is compressed by the compression/expansion processing unit 62 and is recorded in the recording medium 64 by the recording medium control unit 63. In addition, the photographic image data can be displayed on the display unit 66 as a photographic image by the display control unit 65.

Figure 2:
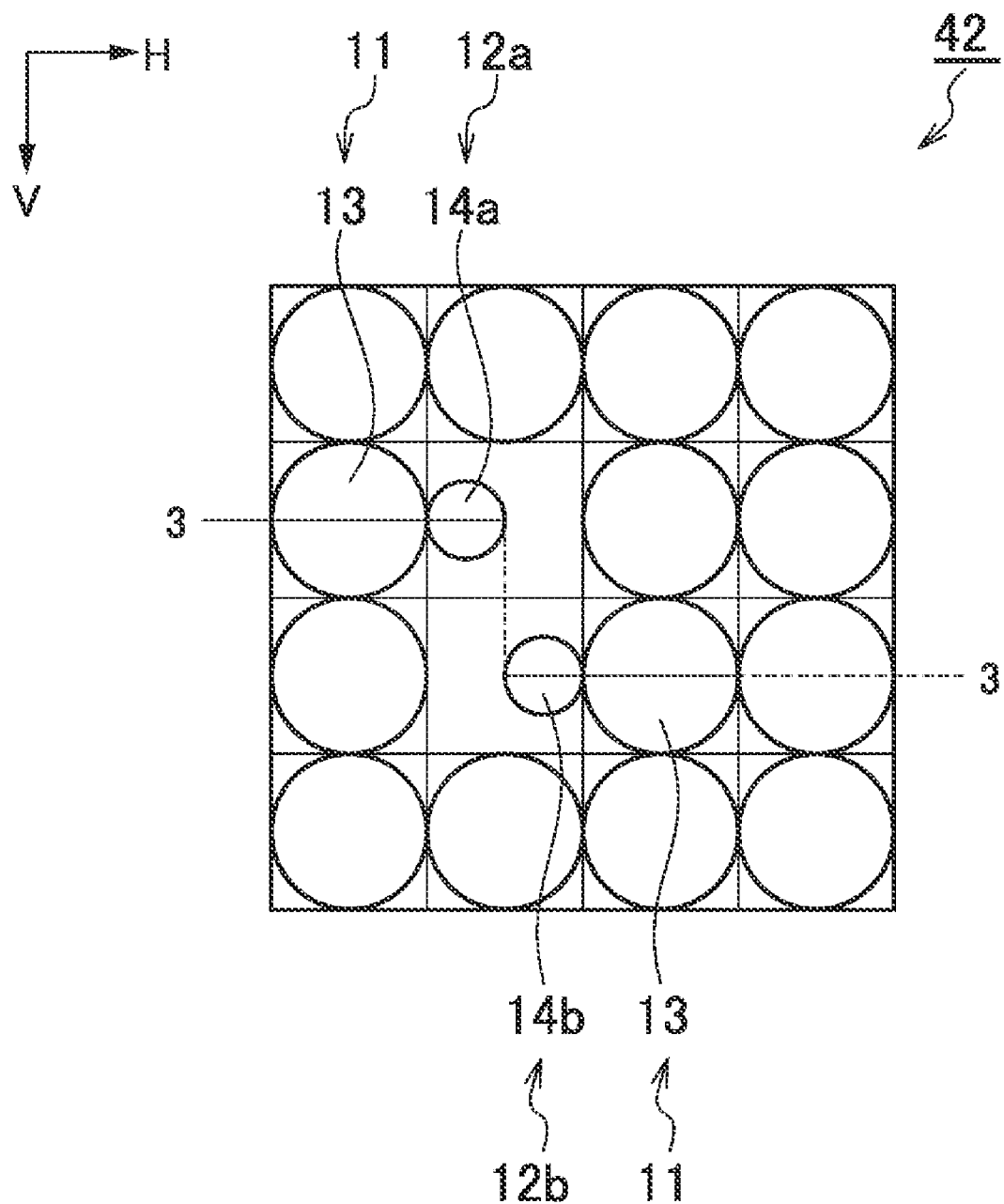
FIG. 2 is a plan view illustrating an example of an imaging unit with a Bayer array.
Figure 3:
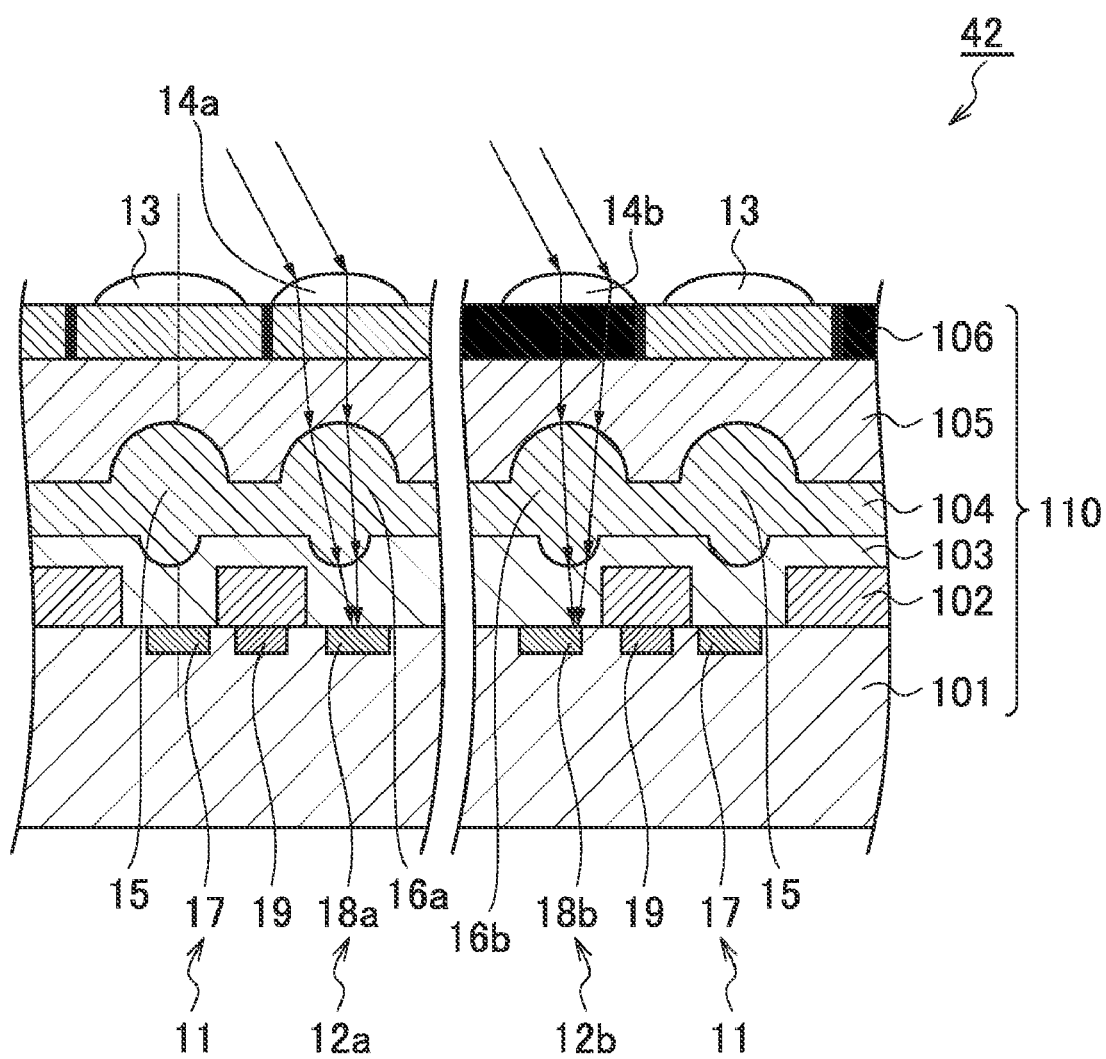
FIG. 3 is a sectional view illustrating a part of a cross section along the line 3-3 in FIG. 2.

FIG. 2 is a plan view illustrating a part of an example of an imaging unit (42 in FIG. 1) with a Bayer array. FIG. 3 is a sectional view illustrating a part of a cross section along the line 3-3 in FIG. 2.

As illustrated in FIG. 2, a first imaging element 11 (photographic element) used for photographic image data generation, a second imaging element 12a (a first phase difference detection element) used for phase difference detection, and a third imaging element 12b (a second phase difference detection element) are arranged in an array pattern on a light receiving surface (paper in FIG. 2) which receives object light passing through a photographic lens (40 in FIG. 1). Note that in fact, a large number of imaging elements 11, 12a, and 12b are arranged on the light receiving surface.

Each of the imaging elements 11, 12a, and 12b includes respective top microlenses 13, 14a, and 14b formed on an uppermost surface of a laminated structure 110 (chip) (also referred to as "on-chip microlenses"), respective inner microlenses 15, 16a, and 16b formed inside the laminated structure 110 (also referred to as "internal microlenses"), and respective photodiodes 17, 18a, and 18b performing photoelectric conversion (also referred to as "photoelectric conversion element").

Each of the top microlenses 13, 14a, and 14b collects light passing through the photographic lens 40. Each of the inner microlenses 15, 16a, and 16b collects light passing through each of the respective top microlenses 13, 14a, and 14b. Each of the photodiodes 17, 18a, and 18b receives light passing through each of the respective inner microlens 15, 16a, and 16b and accumulates a signal charge corresponding to the amount of received light. The accumulated signal charge is read as pixel information for each of the imaging elements 11, 12a, and 12b under the control of the imaging control unit (43 in FIG. 1).

A group of the photodiodes 17 of the photographic element 11 collects light passing through an entire region of the exit pupil of the photographic lens 40. A group of the photodiodes 18a of the first phase difference detection element 12a collects object light passing through one partial region of the exit pupil of the photographic lens 40. A group of photodiodes 18b of the second phase difference detection element 12b receives object light passing through the other partial region of the exit pupil of the photographic lens 40.

The imaging unit 42 according to the present embodiment is configured such that a light shielding film 102, an insulating film 103, a lens layer 104, a flat layer 105, and a color filter layer 106 are laminated on a semiconductor substrate 101. Photodiodes 17, 18a, and 18b, and a VCCD 19 (vertical charge transfer path) are formed on the semiconductor substrate 101. The light shielding film 102 is formed on a region separating between the photodiodes 17, 18a, and 18b of an upper surface of the semiconductor substrate 101. The insulating film 103 is formed of an insulating material having light transmissibility. The internal microlenses 17, 18a, and 18b are formed in the lens layer 104. The flat layer 105 is formed of a light-transmissive material. Color filters of red (R), green (G), and blue (B) are formed in the color filter layer 106.

The photographic element 11 is configured such that the optical axis of the top microlens 13, the optical axis of the inner microlens 15, and the optical axis of the photodiode 17 are matched. The relationship among the optical axis of the top microlenses 14 (14a and 14b), the optical axis of the inner microlenses 15 (15a and 15b), and the optical axis of the photodiodes 17 (17a and 17b) in the phase difference detection elements 12 (12a and 12b) will be described in detail later separately in various embodiments.

Each of the top microlenses 14a and 14b of the respective phase difference detection elements 12a and 12b according to the present embodiment has a smaller diameter than the diameter of the top microlens 13 of the photographic element 11. Moreover, each of the photodiodes 18a and 18b of the respective phase difference detection elements 12a and 12b according to the present embodiment has the same shape as the shape of the photodiode 17 of the photographic element 11.

Figure 4:
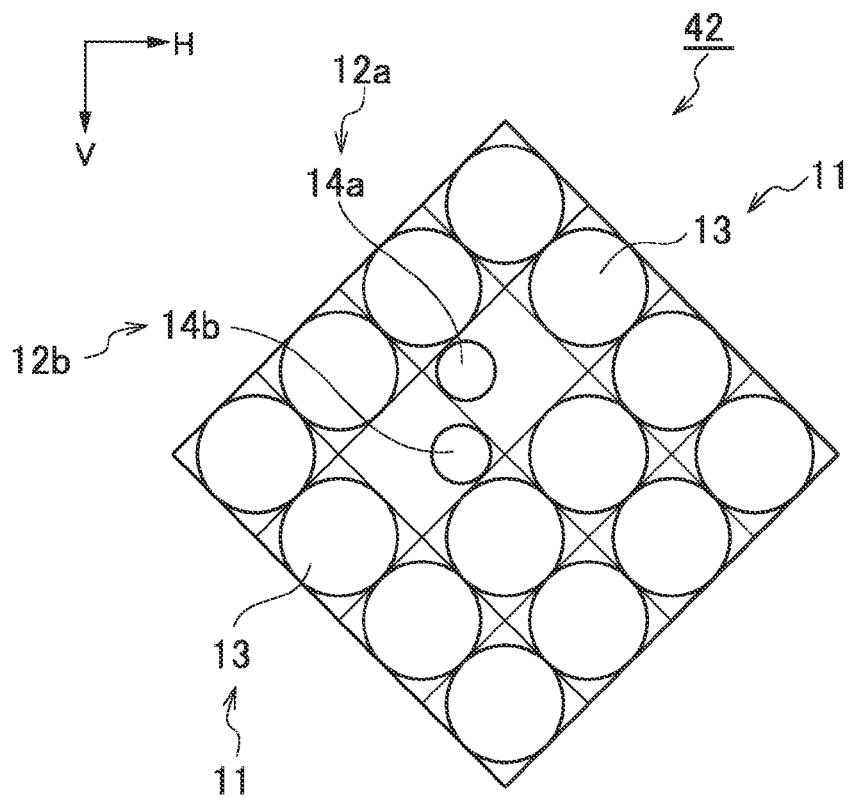
FIG. 4 is a plan view illustrating an example of an imaging unit with a honeycomb configuration.

FIG. 4 is a plan view illustrating a part of an example of an imaging unit (42 in FIG. 1) with a honeycomb configuration. Note that in FIG. 4, the same reference numeral or character is assigned to the same element as the element in a Bayer array illustrated in FIG. 2.

In the honeycomb configuration, photodiodes in even rows are shifted by ½ pitch from photodiodes in odd rows.

Hereinafter, various imaging units 42 (imaging apparatuses) according to the presently disclosed subject matter will be described for each embodiment.

First, an imaging unit 42 according to a first embodiment will be described. Note that what has been described by referring to FIGS. 2 to 4 will be omitted here.

Figure 5:
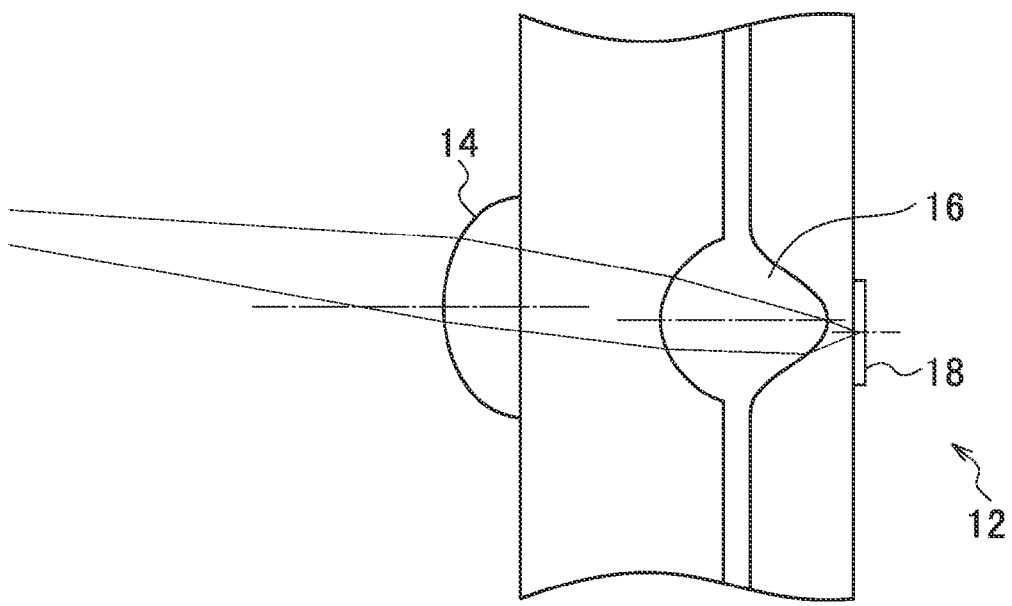
FIG. 5 is a sectional view illustrating a phase difference detection element according to a first embodiment.

FIG. 5 is a sectional view illustrating a phase difference detection element 12 according to the first embodiment. As illustrated in FIG. 5, the phase difference detection element 12 according to the present embodiment is configured such that the optical axis (central axis) of the top microlens 14 is shifted from the optical axis (central axis) of the inner microlens 16. In addition, the optical axis of the inner microlens 16 is shifted from the optical axis of the photodiode 18. Further, the optical axis of the top microlens 14 is shifted from the optical axis of the photodiode 18.

The present embodiment is configured such that the optical axis of the top microlens 14 is shifted from the optical axis of the inner microlens 16. Thus, the photodiode 18 can efficiently receive object light passing through a partial region of the exit pupil of the photographic lens 40, namely, the light whose light receiving direction is restricted.

Next, an imaging unit 42 according to a second embodiment will be described. Note that what has been described in the first embodiment will be omitted here.

Figure 6:
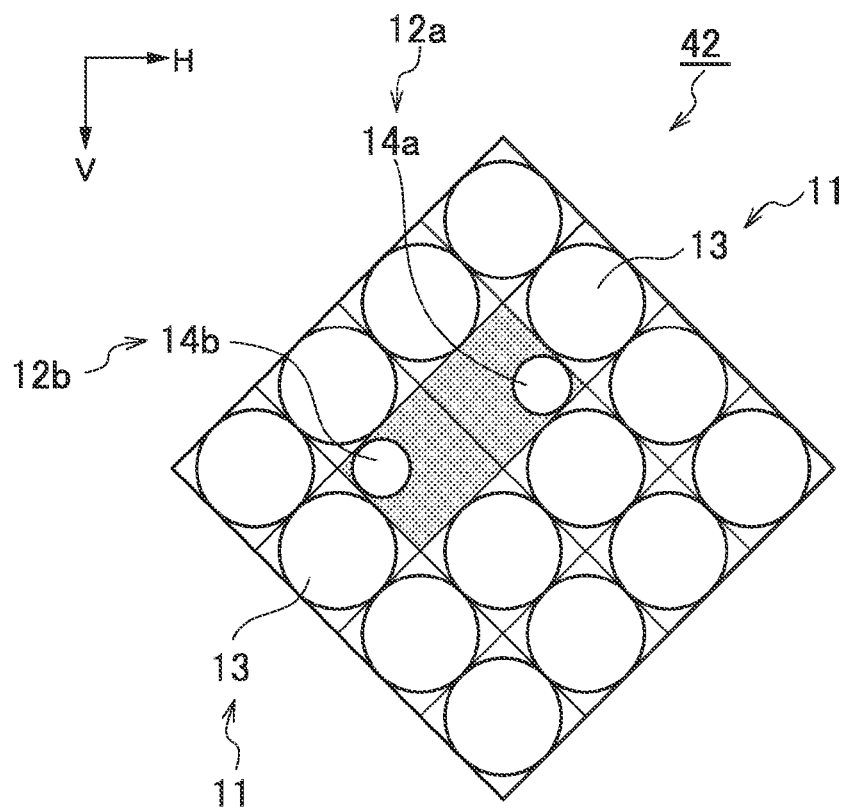
FIG. 6 is a plan view illustrating an example of an imaging unit according to a second embodiment.

FIG. 6 is a plan view illustrating a part of an example of the imaging unit 42 according to the present embodiment. The present embodiment illustrates a honeycomb configuration. As illustrated in FIG. 6, in the present embodiment, a light shielding unit for shielding light is provided around the top microlenses 14 (14a and 14b) of the phase difference detection elements 12 (12a and 12b). Note that the description is given on an example of the honeycomb configuration, but a Bayer array may be used.

Next, an imaging unit 42 according to a third embodiment will be described. Note that what has been described in the first and second embodiments will be omitted here.

Figure 7:
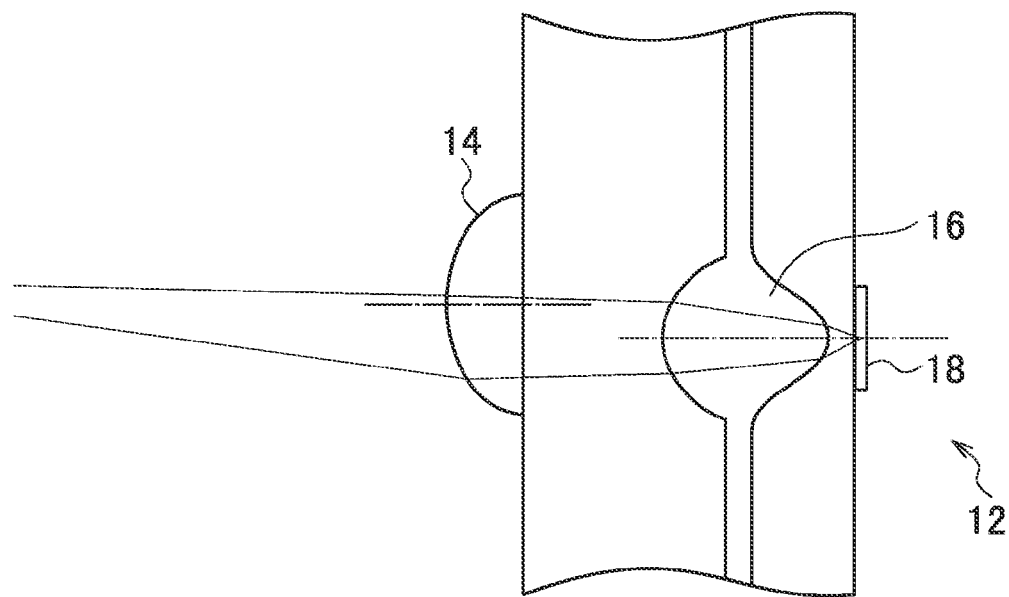
FIG. 7 is a sectional view illustrating a phase difference detection element according to a third embodiment.

FIG. 7 is a sectional view illustrating a phase difference detection element 12 according to the present embodiment. As illustrated in FIG. 7, in the phase difference detection element 12 according to the present embodiment, the optical axis (central axis) of the inner microlens 16 matches the optical axis (central axis) of the photodiode 18.

The phase difference detection element 12 according to the present embodiment can be formed by shifting only the top microlens 14 on the upper surface of a laminated structure (110 in FIG. 3) in comparison with the photographic element 11. Thus, the laminated structure before the top microlens 14 is formed thereon can be easily shared by other imaging devices conforming to a specification in which the phase difference detection element 12 is not provided.

Next, an imaging unit 42 according to a fourth embodiment will be described. Note that what has been described by referring to FIGS. 2 to 4 will be omitted here.

Figure 8:
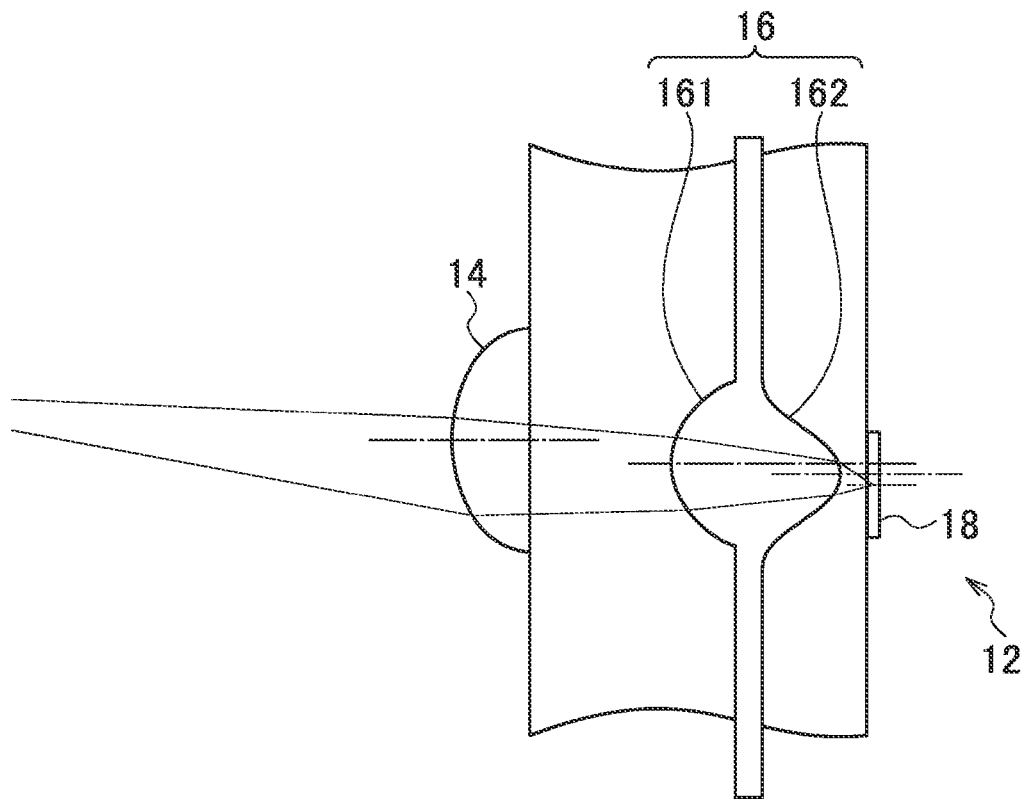
FIG. 8 is a sectional view illustrating a phase difference detection element according to a fourth embodiment.

FIG. 8 is a sectional view illustrating a phase difference detection element 12 according to the present embodiment. As illustrated in FIG. 8, the phase difference detection element 12 according to the present embodiment is configured such that the optical axis (central axis) of the entrance lens 161 of the inner microlens 16 is shifted from the optical axis (central axis) of the exit lens 162. The entrance lens 161 is a convex lens (upper convex lens) on an upstream side of the optical path, and the exit lens is a convex lens (lower convex lens) on a downstream side of the optical path.

Note that the present embodiment is further configured such that the optical axis of the top microlens 14 is shifted from the optical axis of the entrance lens 161 of the inner microlens 16. Furthermore, the optical axis of the entrance lens 161 of the inner microlens 16 is shifted from the optical axis of the photodiode 18.

The present embodiment is configured such that the optical axis of the exit lens 162 is shifted from the optical axis of the entrance lens 161 of the inner microlens 16. Thus, the photodiode 18 for phase difference detection can efficiently receive light passing through a restricted partial region of the exit pupil of the photographic lens 40.

Next, an imaging unit 42 according to a fifth embodiment will be described. Note that what has been described in the fourth embodiment will be omitted here.

Figure 9:
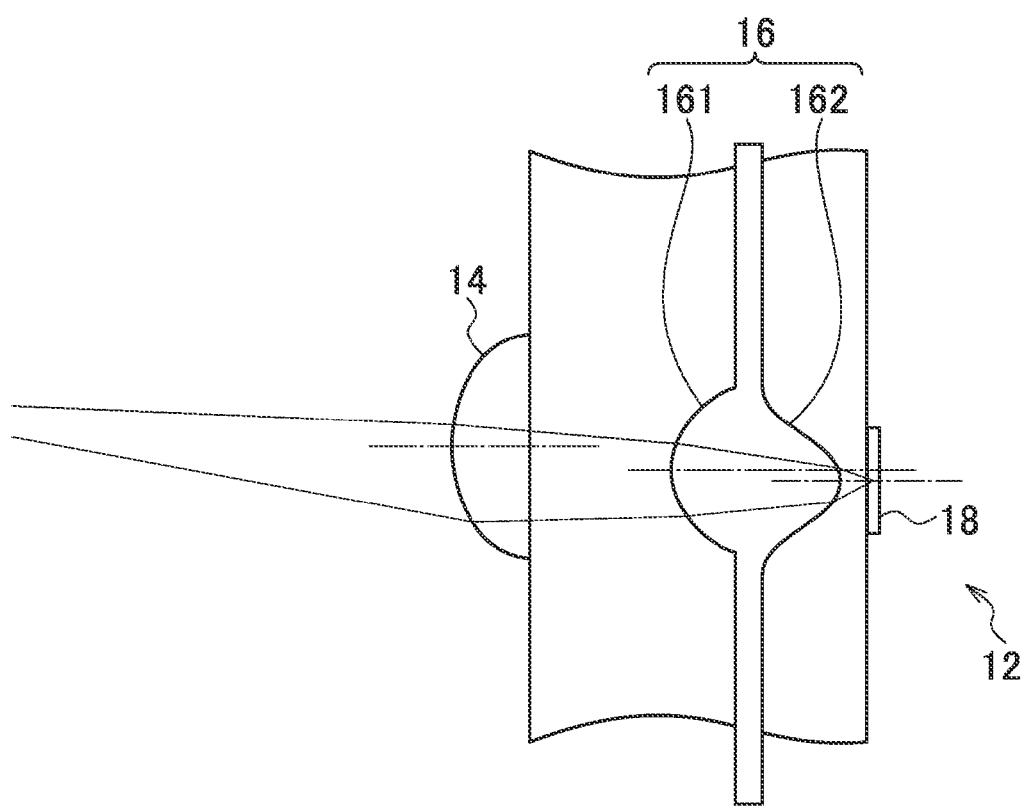
FIG. 9 is a sectional view illustrating a phase difference detection element according to a fifth embodiment.

FIG. 9 is a sectional view illustrating a phase difference detection element 12 according to the present embodiment. As illustrated in FIG. 9, like the photographic element (11 in FIG. 3), in the phase difference detection element 12 according to the present embodiment, the optical axis (central axis) of the inner microlens 16 matches the optical axis (central axis) of the photodiode 18.

Thus, the electrode arrangement for reading the charge accumulated in the photodiode 18 out onto a vertical charge transfer path can be shared between the photographic element 11 and the phase difference detection element 12. In other words, this configuration eliminates the need to shift the electrode for the phase difference detection element 12, and thus can achieve a high density arrangement of imaging elements.

Next, an imaging unit 42 according to a sixth embodiment will be described. The present embodiment restricts an arrangement of the phase difference detection element 12 according to any one of the first to fifth embodiments, and thus what has been described in the first to fifth embodiments will be omitted here.

Figure 10:
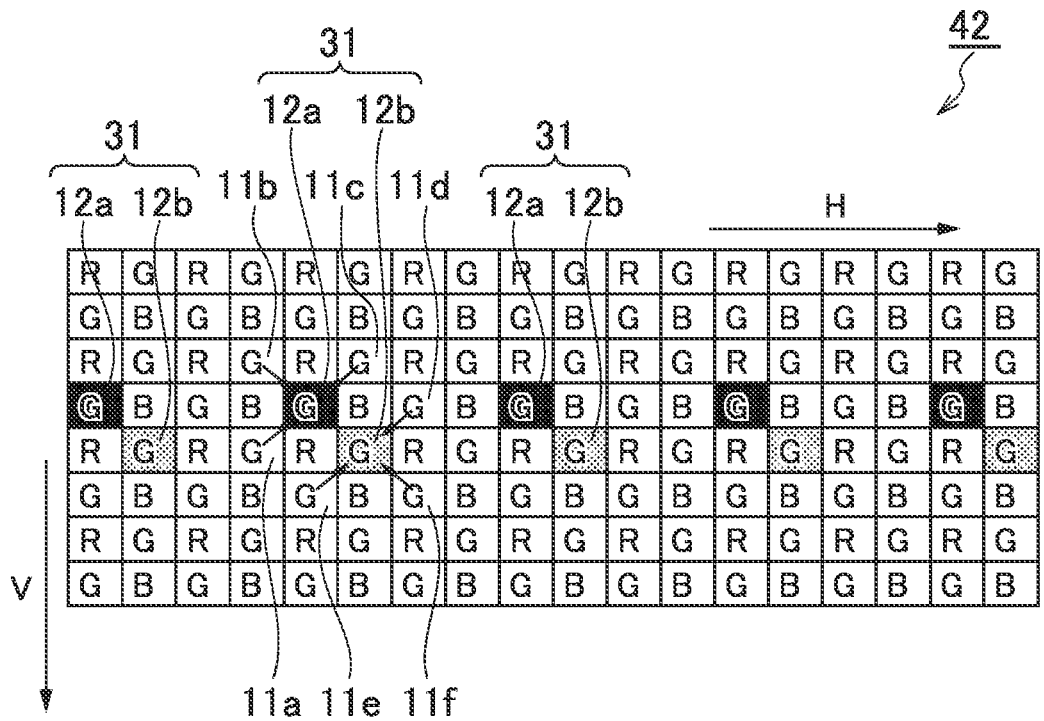
FIG. 10 is a plan view illustrating an element arrangement of an imaging unit according to a sixth embodiment.

FIG. 10 is a plan view illustrating an element arrangement of an imaging unit 42 according to a sixth embodiment. As illustrated in FIG. 10, in the present embodiment, phase difference detection element pairs 31 having a mutually adjacent first phase difference detection element 12a and second phase difference detection element 12b are arranged in an array pattern along the horizontal direction H which is a phase difference detection direction.

In FIG. 10, each of R, G, and B designates a color of the color filter. The photographic element 11 has a color filter of R (red), G (green) or B (blue), and the phase difference detection elements 12 (12a and 12b) has a color filter of G. In addition, three photographic elements 11 having a color filter of the same color (G in the present embodiment) are arranged adjacent to each phase difference detection element 12. One (e.g., 11a) of the photographic elements 11 is located between the phase difference detection element pairs 31. For example, the photographic element 11a of the photographic elements 11a, 11b, and 11c is located between the first phase difference detection elements 12a, and the photographic element 11d of the photographic elements 11d, 11 e, and 11f is located between the second phase difference detection elements 12b.

According to the present embodiment, when the image data generation unit (53 in FIG. 1) interpolates pixel information for photographic image data generation in a pixel position of each phase difference detection element 12, the image data generation unit uses pixel information of the three photographic elements 11 having a color filter of the same color (e.g., G) including one photographic element 11 between the phase difference detection element pairs 31. For example, in FIG. 10, high resolution photographic image data is generated by interpolating pixel information in a position of the first phase difference detection element 12a based on the pixel information read from the three photographic elements 11a, 11b, and 11c as well as by interpolating pixel information in a position of the second phase difference detection element 12b based on the pixel information read from the three photographic elements 11d, 11e, and 11f.

Note that the present embodiment describes an example in which a photographic element 11 is arranged one by one between the same type of phase difference detection elements (between 12a and 12a, or 12b and 12b), but the presently disclosed subject matter is not limited to this example. For example, the presently disclosed subject matter may include various arrangement embodiments in which one or more photographic elements 11 having a color filter of a specific color are arranged between the phase difference detection element pairs 31. Further, the present embodiment describes the horizontal direction H as the phase difference detection direction, but the presently disclosed subject matter may also apply to the vertical direction V as the phase difference detection direction. Furthermore, the present embodiment describes an element array with a Bayer array, but the presently disclosed subject matter may also apply to a honeycomb configuration.

Next, an imaging unit 42 according to a seventh embodiment will be described. The present embodiment further restricts an arrangement of a pair of the phase difference detection elements 12 according to the sixth embodiment, and thus what has been described in the first to sixth embodiments will be omitted here.

Figure 11:
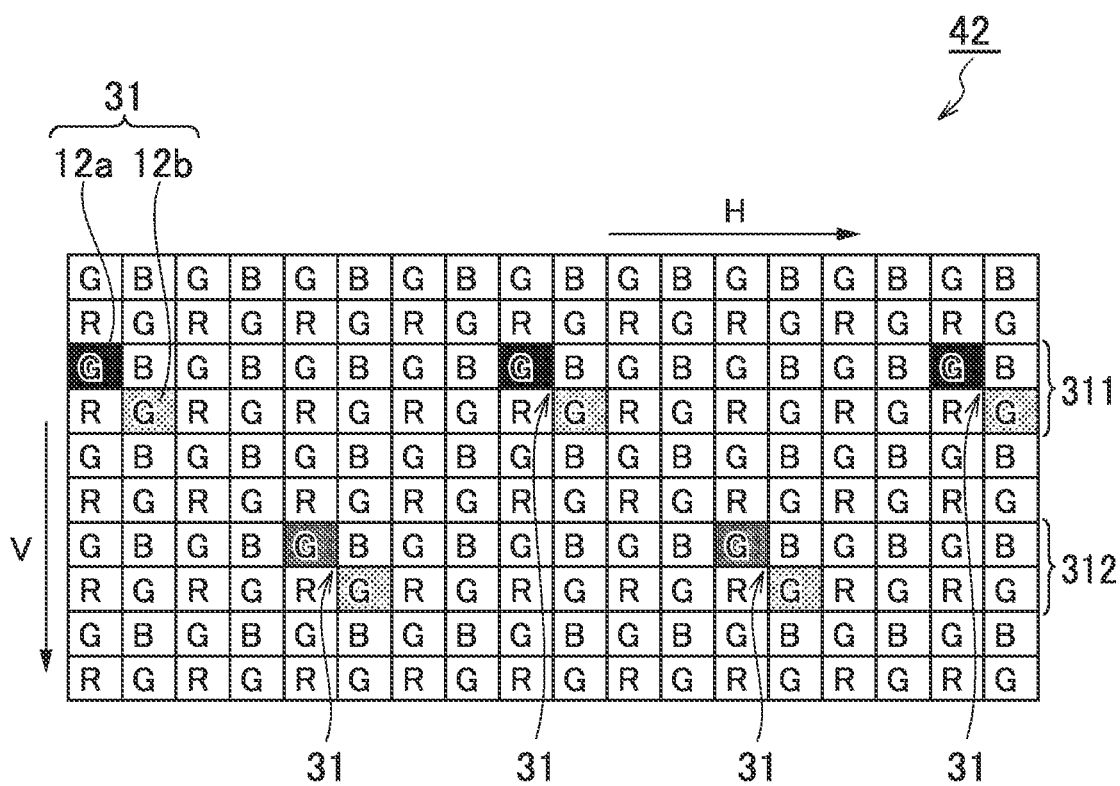
FIG. 11 is a plan view illustrating an element arrangement of an imaging unit according to a seventh embodiment.

FIG. 11 is a plan view illustrating an element arrangement of an imaging unit 42 according to the present embodiment. As illustrated in FIG. 11, phase difference detection element pairs 31 according to the present embodiment are arranged in a staggered pattern. More specifically, a plurality of phase difference detection element pairs 31 are arranged in an alternating pattern between a first pixel pair column 311 in which the plurality of phase difference detection element pairs 31 are arranged in the horizontal direction H and a second pixel pair column 312 in which the plurality of phase difference detection element pairs 31 are arranged in the horizontal direction H.

Next, an imaging unit 42 according to an eighth embodiment will be described. The present embodiment restricts an arrangement of the phase difference detection element 12 according to any one of the first to fifth embodiments, and thus what has been described in the first to fifth embodiments will be omitted here.

Figure 12:
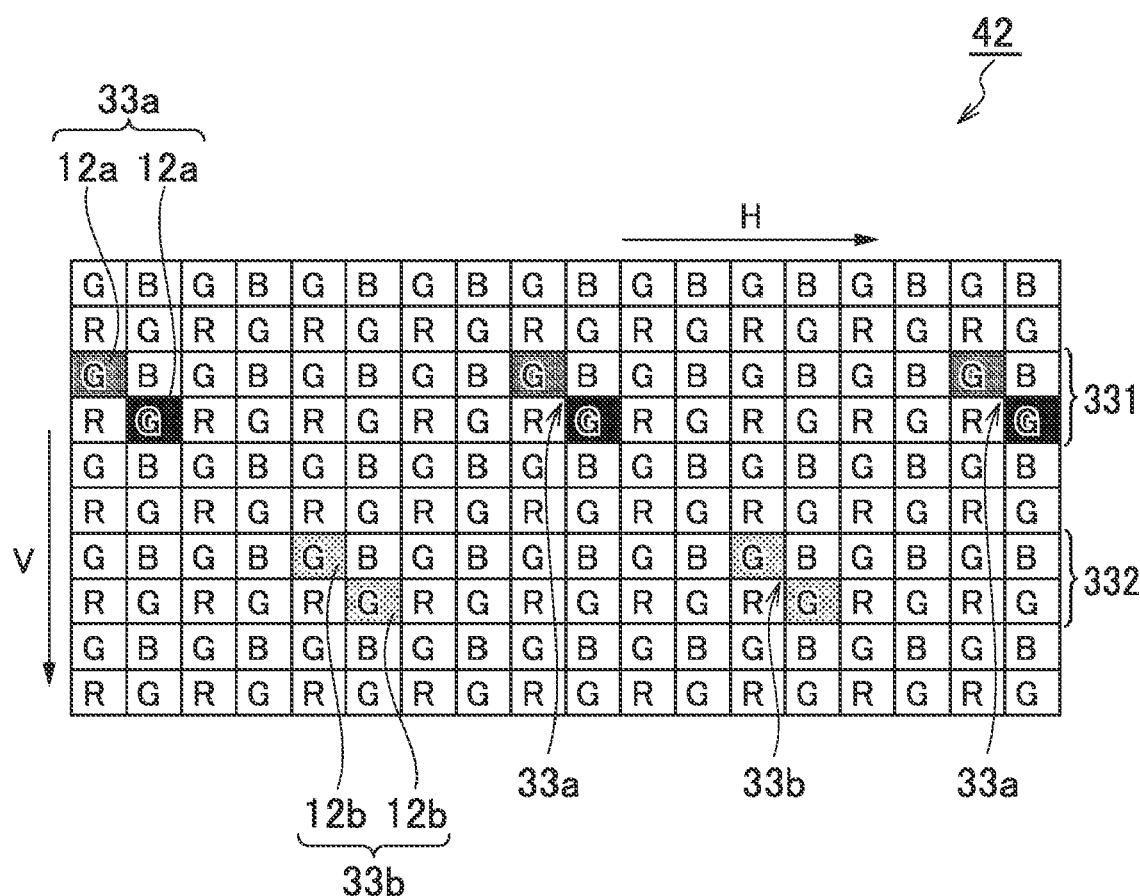
FIG. 12 is a plan view illustrating an element arrangement of an imaging unit according to an eighth embodiment.

FIG. 12 is a plan view illustrating an element arrangement of an imaging unit 42 according to the present embodiment. As illustrated in FIG. 12, in the present embodiment, a phase difference detection element pair 33a having a mutually adjacent pair of the first phase difference detection elements 12a and a phase difference detection element pair 33b having a mutually adjacent pair of the second phase difference detection elements 12b are arranged in an array pattern along the horizontal direction H which is a phase difference detection direction.

According to the present embodiment, when the focus detection unit (51 in FIG. 1) performs focus detection, the pixel information read from a pair of photodiodes 18 is synthesized for each of the phase difference detection element pairs 33a and 33b, and defocus amount is calculated based on the synthesized pixel information. Briefly, pixel information synthesis (pixel mixing) is performed on the two phase difference detection elements 12a and 12b for each phase difference detection element pair.

Next, an imaging unit 42 according to a ninth embodiment will be described. The present embodiment further restricts an arrangement of a pair of the phase difference detection elements 12 according to the seventh embodiment, and thus what has been described in the first to seventh embodiments will be omitted here.

Figure 13:
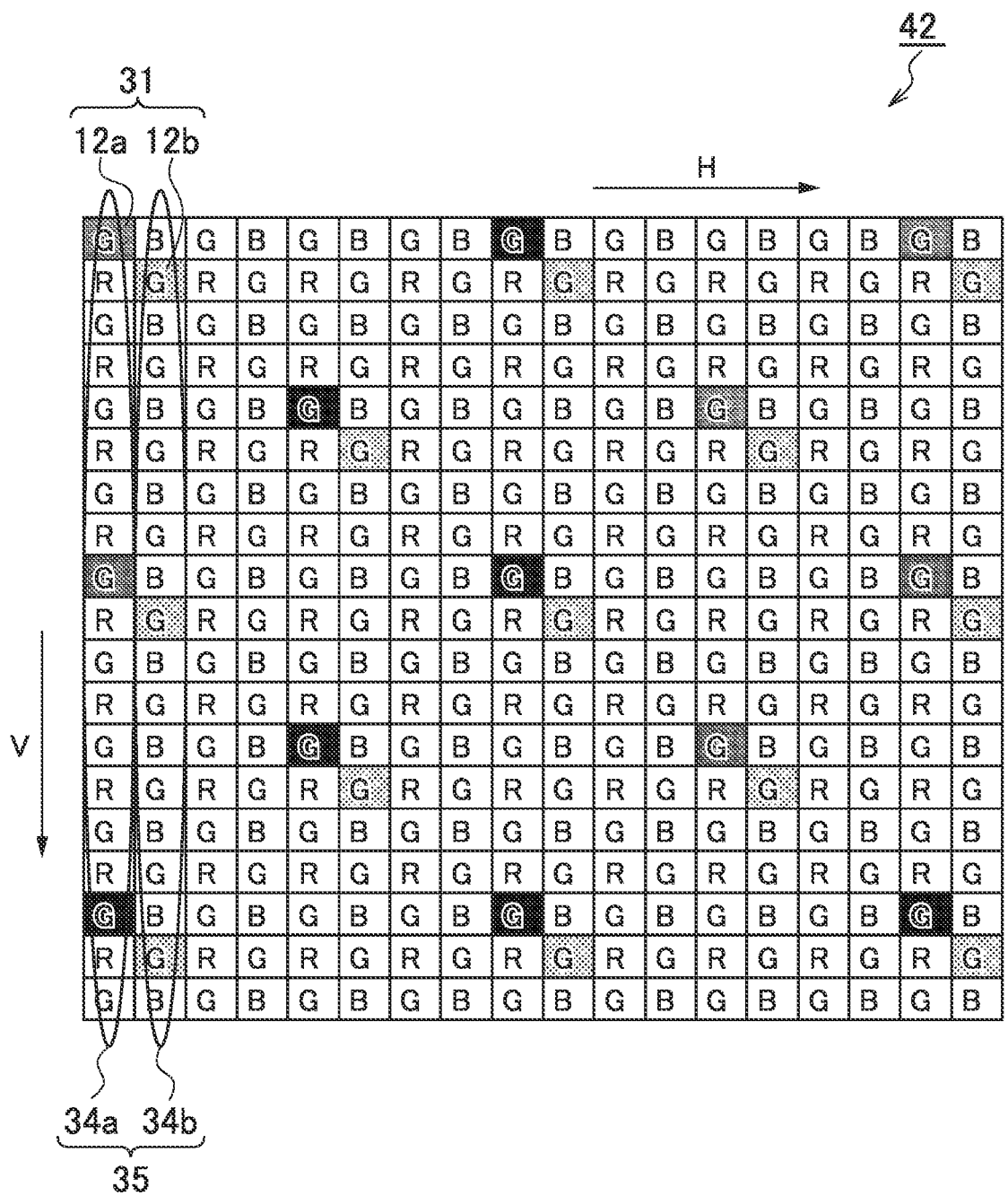
FIG. 13 is a plan view illustrating an element arrangement of an imaging unit according to a ninth embodiment.

FIG. 13 is a plan view illustrating an element arrangement of an imaging unit 42 according to the present embodiment. As illustrated in FIG. 13, according to the present embodiment, phase difference detection element pairs 31 having a mutually adjacent arrangement of the first phase difference detection element 12a and the second phase difference detection element 12b are arranged along a mutually orthogonal first direction (horizontal direction H in the present embodiment) and a second direction (vertical direction V in the present embodiment); and an arrangement pitch between the phase difference detection element pairs 31 in the first direction H for phase difference detection is equal to or less than the arrangement pitch between the phase difference detection element pairs 31 in the second direction V for pixel mixing.

The present embodiment provides a column pair 35 including a column 34a of the first phase difference detection element 12a and a column 34b of the second phase difference detection element 12b along the second direction V, and arranges a plurality of the column pairs 35 in the first direction H.

According to the present embodiment, when the focus detection unit (51 in FIG. 1) performs focus detection, pixel information is synthesized between a plurality of the first phase difference detection elements 12a arranged along the second direction as well as pixel information is synthesized between a plurality of the second phase difference detection elements 12b arranged along the second direction, and defocus amount is calculated based on the synthesized pixel information. Briefly, pixel information synthesis is performed for each column 34a of the first phase difference detection elements 12a and for each column 34b of the second phase difference detection elements 12b.

Note that the presently disclosed subject matter is not limited to the imaging unit described using FIGS. 10 to 13. The presently disclosed subject matter can be applied to a double faced imaging unit including a surface "A" and a surface "B" capable of controlling imaging mutually independently. Such a double face configuration enables mutually independent charge accumulation control and reading control. More specifically, switching can be easily performed between a high dynamic range photography in which the surface "A" and the surface "B" are exposed with different exposure time, photographic pixel information of the surface "A" is synthesized with photographic pixel information of the surface "B", and a high dynamic range imaging image is acquired and recorded; and a high resolution photography in which the surface "A" and the surface "B" are exposed with the same exposure time and high resolution imaging image including photographic pixel information of the surface "A" and the surface "B" is acquired and recorded.

Figure 14:
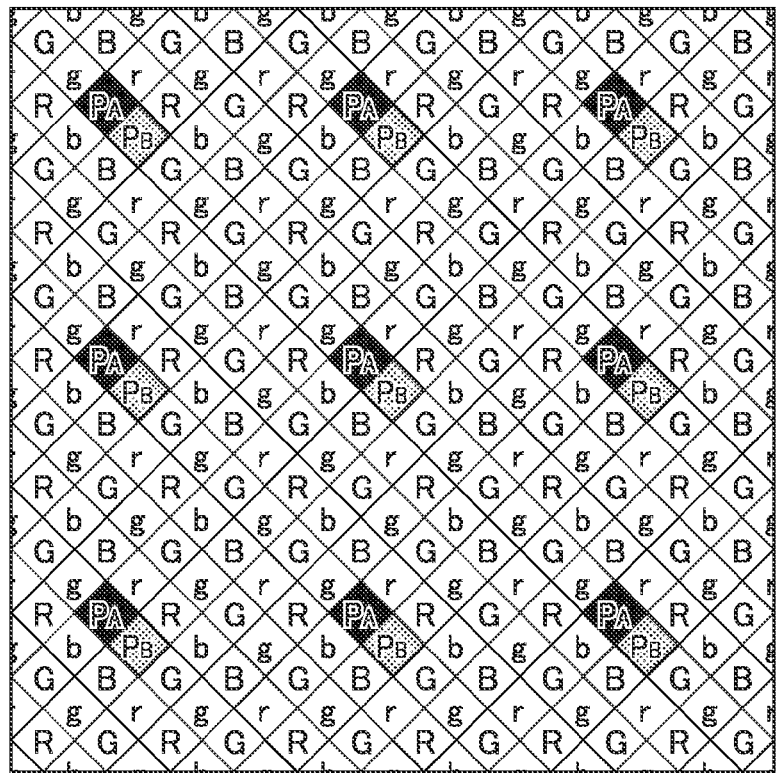
FIG. 14 is a plan view illustrating an example of a double faced honeycomb configuration.

FIG. 14 is a plan view illustrating an example of a double faced honeycomb configuration. The following description focuses on what is different from the imaging unit 42 illustrated in FIGS. 10 to 13.

In FIG. 14, an uppercase character R, G, or B designates a photographic element (11 in FIG. 2) on the surface "A"; a lowercase character r, g, or b designates a photographic element (11 in FIG. 2) on the surface "B"; $P_A$ designates a phase difference detection element (12a or 12b in FIG. 2) on the surface "A"; and $P_B$ designates a phase difference detection element (12a or 12b in FIG. 2) on the surface "B". Further, R or r designates an element with a red color filter; G or g designates an element with a green color filter; and B or b designates an element with a blue color filter. Note that each of the phase difference detection elements $P_A$ and $P_B$ according to the present embodiment is an element with a green color filter.

According to the present embodiment, a group of pixels R, G, B, $P_A$ on the surface "A" is arranged in a square lattice; a group of pixels r, g, b, $P_B$ on the surface "B" is arranged in a square lattice as well as at an inter-lattice position of a pixel group on the surface "A", which provides a honeycomb configuration as a whole. The honeycomb configuration is such that elements in odd rows are shifted by ½ pixel (element) pitch from elements in even rows.

In such an imaging unit, a pair of phase difference detection elements $P_A$ and $P_B$ is arranged in an array pattern along the horizontal direction and the vertical direction.

Figure 15:
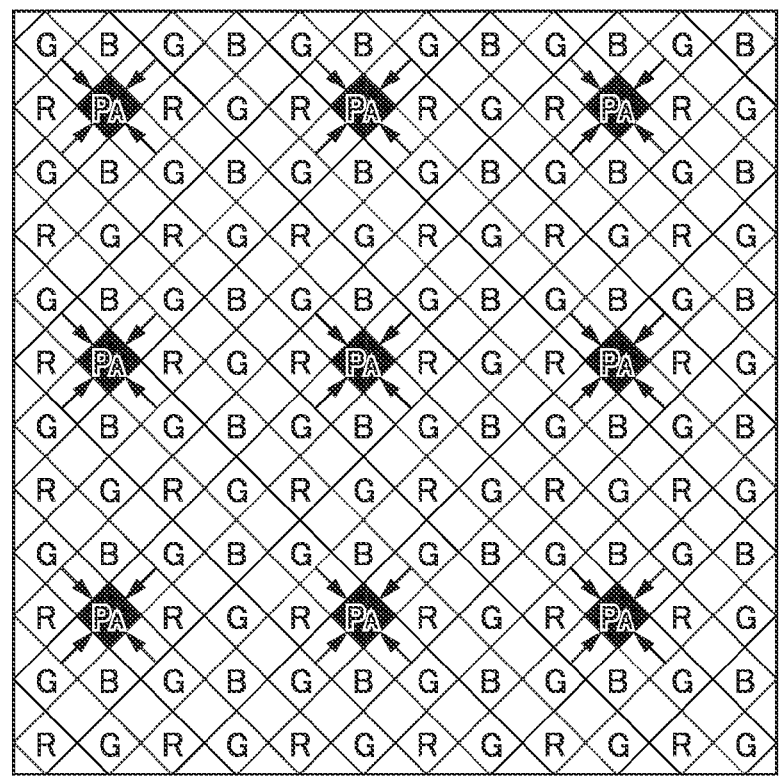
FIG. 15 is a plan view describing pixel information interpolation on an element array plane "A" in FIG. 14.
Figures 16, 17:
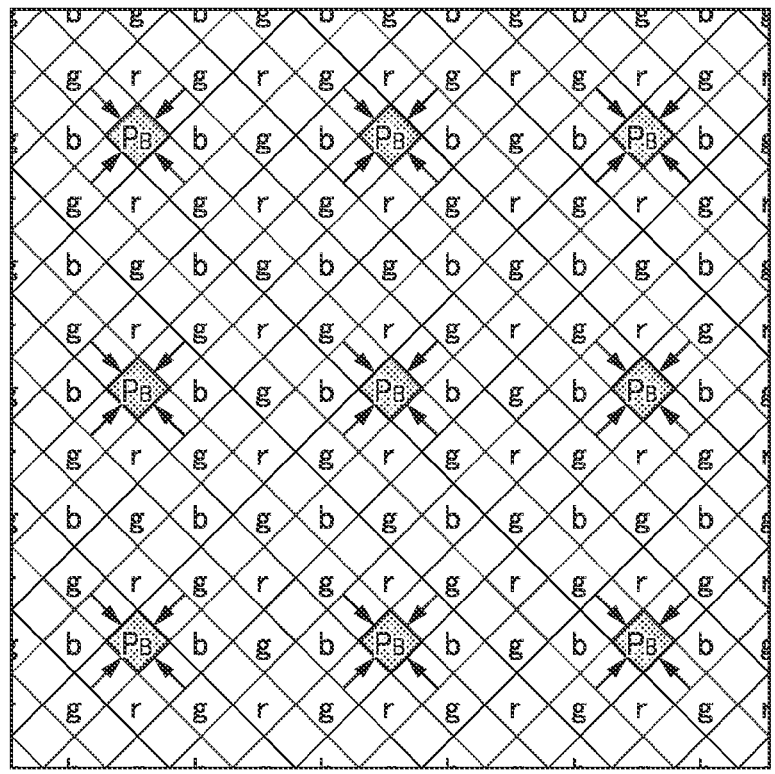
FIG. 16 is a plan view describing pixel information interpolation on an element array plane "B" in FIG. 14.
FIG. 17 is a plan view illustrating an example of a double faced Bayer array.

FIG. 15 illustrates an interpolation of photographic pixel information in a position of the phase difference detection element $P_A$ on the surface "A". FIG. 16 illustrates an interpolation of photographic pixel information in a position of the phase difference detection element $P_B$ on the surface "B". As illustrated in FIG. 15, with a focus only on the imaging elements on the surface "A", four photographic elements having a color filter of the same color (G in the present embodiment) are arranged adjacent to each phase difference detection element $P_A$. When the image data generation unit (53 in FIG. 1) interpolates photographic pixel information in a pixel position of each phase difference detection element $P_A$, the image data generation unit uses pixel information of four photographic elements which are adjacent to each phase difference detection element $P_A$ on the surface "A" and have a color filter of the same color. As illustrated in FIG. 16, also on the surface "B", four photographic elements having a color filter of the same color (G in the present embodiment) are arranged adjacent to each phase difference detection element $P_B$. Like on the surface "A", the image data generation unit interpolates photographic pixel information in a pixel position of each phase difference detection element $P_B$.

Figure 18:
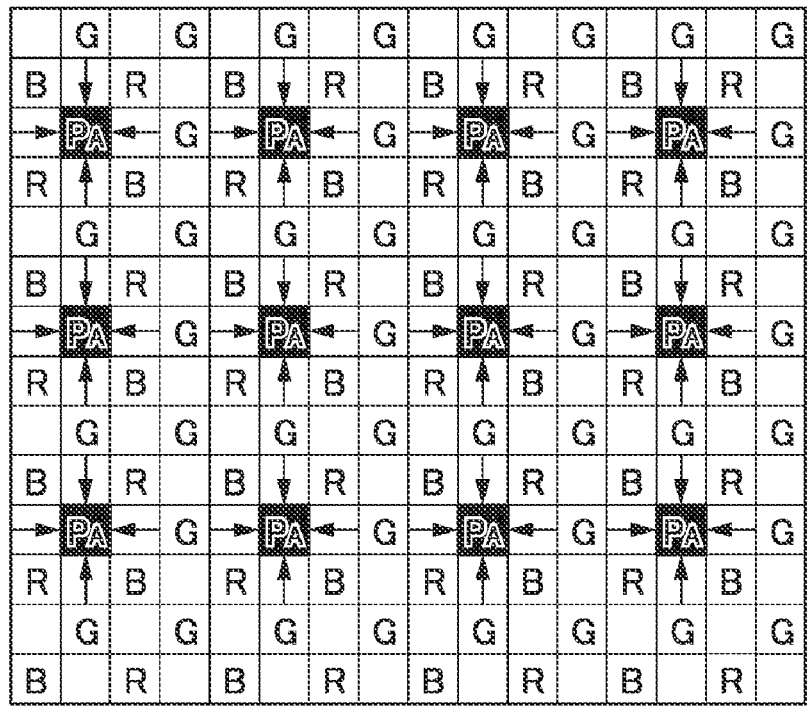
FIG. 18 is a plan view describing pixel information interpolation on an element array plane "A" in FIG. 17.
Figure 19:
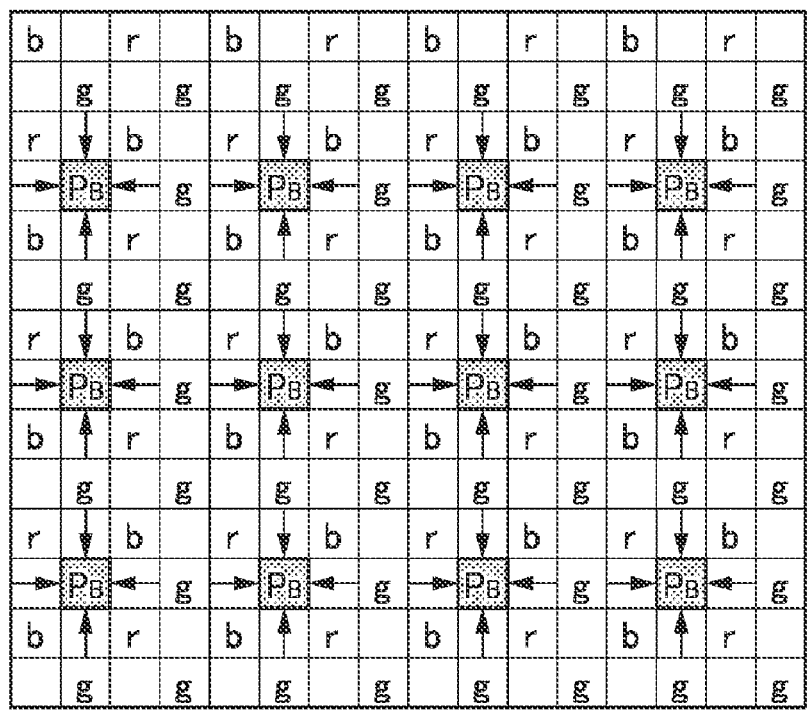
FIG. 19 is a plan view describing pixel information interpolation on an element array plane "B" in FIG. 17.

FIG. 17 is a plan view illustrating an example of a double faced Bayer array. The element arrangement illustrated in FIG. 17 is different from the element arrangement illustrated in FIG. 14 in that FIG. 17 uses a Bayer array, whereas FIG. 14 uses a honeycomb configuration. However, the element arrangement illustrated in FIG. 17 is the same as the element arrangement illustrated in FIG. 14 in that a pair of phase difference detection elements $P_A$ and $P_B$ is arranged in an array pattern along the horizontal direction and the vertical direction. FIG. 18 illustrates an interpolation of photographic pixel information in a position of the phase difference detection element $P_A$ on the surface "A". FIG. 19 illustrates an interpolation of photographic pixel information in a position of the phase difference detection element $P_B$ on the surface "B". As illustrated in FIGS. 18 and 19, on each of the surfaces "A" and "B", four photographic elements having a color filter of the same color (G in the present embodiment) are arranged adjacent to each of the phase difference detection elements $P_A$ and $P_B$. When the image data generation unit (53 in FIG. 1) interpolates photographic pixel information in a pixel position of each of the phase difference detection elements $P_A$ and $P_B$, the image data generation unit uses pixel information of four photographic elements which are adjacent to each of the phase difference detection elements $P_A$ and $P_B$ and have a color filter of the same color.

Note that the double faced element arrangement illustrated in FIGS. 14 and 17 are just an example and as described in FIG. 11, the element arrangement may be such that phase difference detection element pairs are arranged in a staggered pattern. Further, as described in FIG. 12, the element arrangement may be such that the first phase difference detection element pair having a mutually adjacent pair of the first phase difference detection elements (12a in FIG. 2) and the second phase difference detection element pair having a mutually adjacent pair of the second phase difference detection elements (12b in FIG. 2) are arranged in an array pattern. Furthermore, as described in FIG. 13, the arrangement pitch may be such that the arrangement pitch between the phase difference detection element pairs in the horizontal direction for phase difference detection is equal to or less than the arrangement pitch between the phase difference detection element pairs in the vertical direction for pixel mixing.

Hereinafter, a method of manufacturing the imaging unit 42 will be briefly described by referring to FIG. 3.

First, the semiconductor substrate 101 is prepared. Then, the photodiodes 17, 18a, and 18b, the vertical charge transfer path 19, and the like are formed on the semiconductor substrate 101. Here, the photodiodes 17, 18a, and 18b may be formed with the same shape and size for photographing and for phase difference detection.

Then, the light shielding film 102 is formed on the semiconductor substrate 101. Here, the light shielding film 102 is formed on a region separating between the photodiodes 17, 18a, and 18b, and an opening is formed on each of the photodiodes 17, 18a, and 18b.

Then, the insulating film 103, the lens layer 104, and the flat layer 105 are formed on the semiconductor substrate 101 and the light shielding film 102. The lens layer 104 can be formed by patterning. Note that in FIG. 3, as the inner microlenses 15, 16a, and 16b, both of a convex entrance lens on an upstream side of the optical path and a convex exit lens on a downstream side of the optical path are formed, but only the entrance lens may be formed.

Then, the color filter layer 106 is formed on the flat layer 105. Note that FIGS. 10 to 13 illustrate an example in which a color filter of G (green) is formed as the color filter of the phase difference detection elements 12a and 12b, but a color filter of other color may be formed. Further, the phase difference detection elements 12a and 12b may be transparent without using a color filter.

Thus, the laminated structure 110 is configured except the top microlenses 13, 14a, and 14b.

Then, the top microlenses 13, 14a, and 14b are formed by patterning on an uppermost surface (on the color filter layer 106 according to the present embodiment) of the laminated structure 110. Here, according to the above described third embodiment, switching between forming the top microlenses 14a and 14b for phase difference detection and forming only the top microlens 13 for photographing can be performed by switching the photo mask at patterning.

Figure 20:
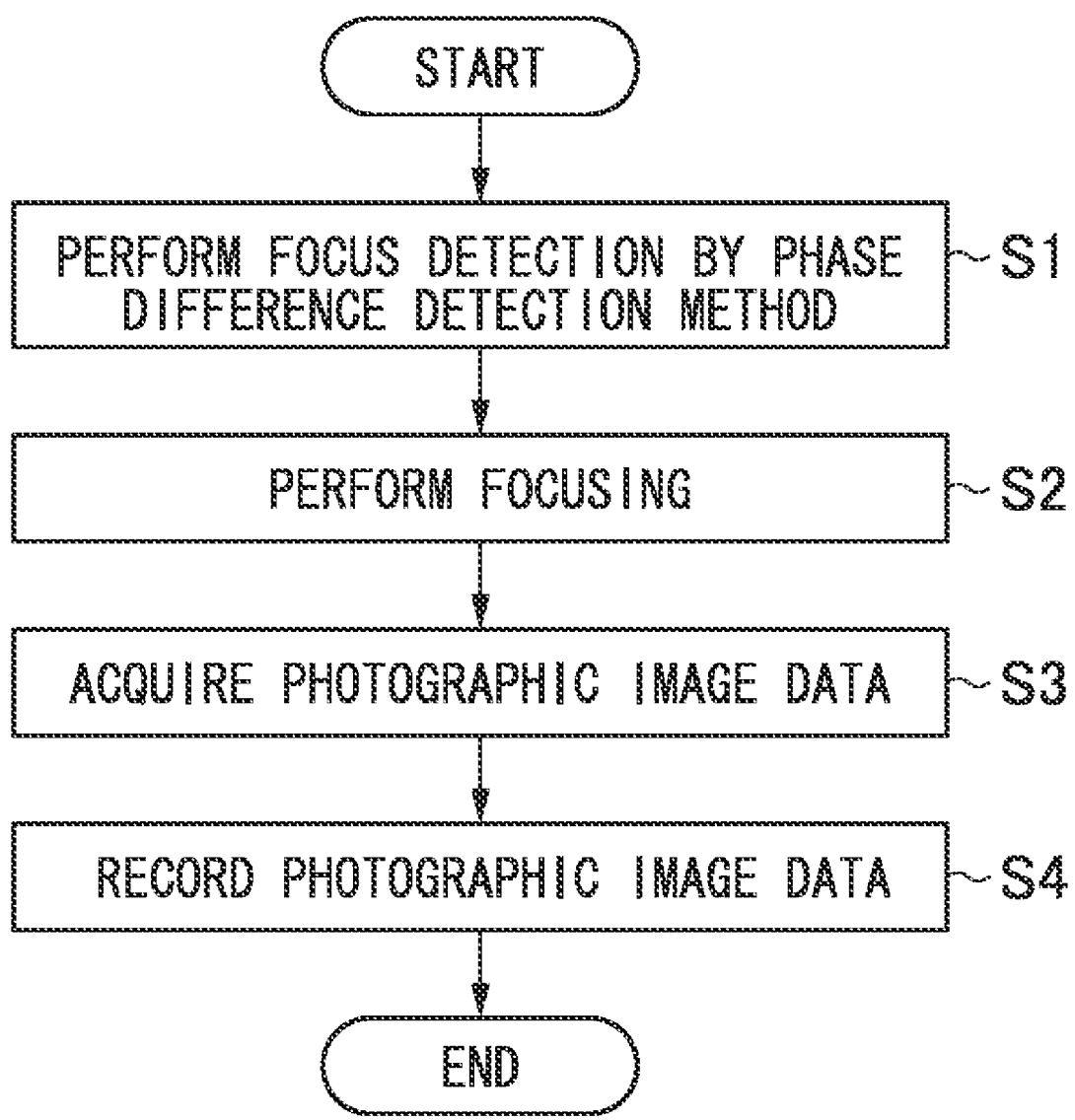
FIG. 20 is a schematic flowchart illustrating a flow of an example of a photographing process.

FIG. 20 is a schematic flowchart illustrating a flow of an example of a photographing process of the digital camera 100 in FIG. 1. This process is executed according to a program by the CPU 50 in FIG. 1.

First, in step S1, focus detection by phase difference detection method is performed. More specifically, the imaging unit 42 is used to take an image under the control of the imaging control unit 43. Then, the focus detection unit 51 detects defocus amount by detecting a phase difference between the pixel information read from the photodiodes 18a of a plurality of the first phase difference detection elements 12a and the pixel information read from the photodiodes 18b of a plurality of the second phase difference detection elements 12b.

Note that when an arrangement pitch between the phase difference detection elements 12a and 12b increases, it is preferable to perform pixel mixing in this step to ensure low intensity performance. For example, for the imaging unit 42 according to the eighth embodiment illustrated in FIG. 12, pixel mixing is performed on the first phase difference detection element pair 33a as well as pixel mixing is performed on the second phase difference detection element pair 33b. For example, for the imaging unit 42 according to the ninth embodiment illustrated in FIG. 13, pixel mixing is performed on a column 34a of the first phase difference detection element 12a as well as pixel mixing is performed on a column 34b of the second phase difference detection element 12b. In the pixel mixing, pixel information read from the same type and a plurality of phase difference detection elements 12 is synthesized. According to such pixel mixing, even a low density arrangement of phase difference detection elements 12 can suppress reduction in focus detection precision.

Then, in step S2, focusing is performed based on the focus detection results. More specifically, the focusing control unit 52 uses the lens drive unit 41 to move the focus lens by the moving amount corresponding to the defocus amount as needed. In other words, the focus lens is moved to a focusing lens position until the defocus amount reaches 0 (zero).

Then, in step S3, photographic image data is acquired. More specifically, the imaging unit 42 is used to take an image under the control of the imaging control unit 43. Then, the image data generation unit 55 generates photographic image data based on the pixel information read from the photodiodes 17 of a plurality of photographic elements 11.

It is preferable to interpolate pixel information in this step in order to improve image quality of the photographic image data. For example, for the imaging unit 42 according to the sixth embodiment illustrated in FIG. 10, high quality photographic image data is generated by interpolating pixel information for photographic image data generation in a position of each of the phase difference detection elements 12a and 12b based on pixel information of the adjacent photographic elements 11a to 11f for each of the phase difference detection elements 12a and 12b.

Then, in step S4, photographic image data is recorded. More specifically, the recording medium control unit 63 records the photographic image data in the recording medium 64.

Note that the imaging unit 42 is not particularly limited to a CCD imaging device, but may be a CMOS imaging device.

It is to be understood that the presently disclosed subject matter is not limited to the examples described in this description and the examples illustrated in the accompanying drawings, and various design changes and improvements can be made to the presently disclosed subject matter without departing from the spirit and scope of the presently disclosed subject matter.

What is claimed is:

1. An imaging device comprising
   an arrayed imaging element group configured to receive light passing through a photographic lens, wherein
   the imaging element group includes a plurality of photographic elements used for photographic image data generation and a plurality of phase difference detection elements used for phase difference detection for focus detection of the photographic lens,
   each of the photographic elements and each of the phase difference detection elements include: an on-chip microlens configured to collect light passing through the photographic lens; a photoelectric conversion element configured to receive the light passing through the on-chip microlens; and an internal microlens disposed between the on-chip microlens and the photoelectric conversion element,
   the photographic element is configured such that an optical axis of the on-chip microlens matches an optical axis of the internal microlens, and
   the phase difference detection element is configured such that the optical axis of the on-chip microlens is shifted from the optical axis of the internal microlens.

2. The imaging device according to claim 1, wherein both the photographic element and the phase difference detection element are configured such that the optical axis of the internal microlens matches the optical axis of the photoelectric conversion element.

3. The imaging device according to claim 1, wherein the photoelectric conversion element of the phase difference detection element has the same shape as that of the photoelectric conversion element of the photographic element.

4. The imaging device according to claim 1, wherein the on-chip microlens of the phase difference detection element has a smaller diameter than the diameter of the on-chip microlens of the photographic element.

5. The imaging device according to claim 4, further comprising
   a light shielding unit around the on-chip microlens of the phase difference detection element.

6. The imaging device according to claim 1, further comprising
   a first and a second of the phase difference detection elements configured to generate pixel information corresponding to light passing through mutually different partial regions of the exit pupil of the photographic lens, wherein
   a mutually adjacent pair of elements including the first and the second of the phase difference detection elements is arranged in an array pattern.

7. The imaging device according to claim 6, wherein three or more of the photographic elements having a color filter of the same color are arranged adjacent to each of the phase difference detection elements.

8. An electronic camera comprising:
   the imaging device according to claim 7;
   a focus detection device configured to perform focus detection of the photographic lens based on pixel information read from the phase difference detection element;
   a focusing control device configured to perform focusing of the photographic lens based on a focus detection result of the focus detection device; and
   an image data generation device configured to generate photographic image data based on pixel information read from the photographic element, and generate the photographic image data by interpolating photographic pixel information in a position of each of the phase difference detection elements based on pixel information read from the photographic element which is arranged adjacent to each of the phase difference detection elements and has the color filter of the same color.

9. The imaging device according to claim 1, further comprising
   a first and a second of the phase difference detection elements which generate pixel information corresponding to light passing through mutually different partial regions of the exit pupil of the photographic lens, wherein
   a mutually adjacent element pair including the first and second phase difference detection elements is arranged in a staggered pattern.

10. An electronic camera comprising:
    the imaging device according to claim 9;
    a focus detection device configured to perform focus detection of the photographic lens based on pixel information read from the element pair including the first and second phase difference detection elements;
    a focusing control device configured to perform focusing of the photographic lens based on a focus detection result of the focus detection device; and
    an image data generation device configured to generate photographic image data based on pixel information read from the photographic element.

11. The imaging device according to claim 1, further comprising
    a first and a second of the phase difference detection elements configured to generate pixel information corresponding to light passing through mutually different partial regions of the exit pupil of the photographic lens, wherein a first element pair having a mutually adjacent pair of the first phase difference detection elements and a second element pair having a mutually adjacent pair of the second phase difference detection elements are arranged in an array pattern.

12. An electronic camera comprising:

the imaging device according to claim 11;

a focus detection device configured to synthesize pixel information read from a pair of the photoelectric conversion elements for each of the element pairs, and perform focus detection of the photographic lens based on synthesized pixel information, a focusing control device configured to perform focusing of the photographic lens based on a focus detection result of the focus detection device; and an image data generation device configured to generate photographic image data based on pixel information read from the photographic element.

13. The imaging device according to claim 1, further comprising a first and a second of the phase difference detection elements configured to generate pixel information corresponding to light passing through mutually different partial regions of the exit pupil of the photographic lens, wherein a mutually adjacent element pair including the first and second phase difference detection elements is arranged in an array pattern along a first direction for detecting phase difference and a second direction for synthesizing the pixel information, and an arrangement pitch of the element pair in the first direction is equal to or less than arrangement pitch of the element pair in the second direction.

14. An electronic camera comprising:

the imaging device according to claim 13;

a focus detection device configured to synthesize pixel information of the photoelectric conversion elements between a plurality of the first phase difference detection elements arranged along the second direction, synthesize pixel information of the photoelectric conversion elements between a plurality of the second phase difference detection elements arranged along the second direction, and perform focus detection of the photographic lens based on synthesized pixel information, a focusing control device configured to perform focusing of the photographic lens based on a focus detection result of the focus detection device; and an image data generation device configured to generate photographic image data based on pixel information read from the photographic element.

15. An electronic camera comprising:

the imaging device according to claim 1;

a focus detection device configured to perform focus detection of the photographic lens based on pixel information read from the phase difference detection element;

a focusing control device configured to perform focusing of the photographic lens based on a focus detection result of the focus detection device; and an image data generation device configured to generate photographic image data based on pixel information read from the photographic element.

16. An imaging device comprising an arrayed imaging element group configured to receive light passing through a photographic lens, wherein the imaging element group includes a plurality of photographic elements used for photographic image data generation and a plurality of phase difference detection elements used for phase difference detection for focus detection of the photographic lens, each of the photographic elements and each of the phase difference detection elements include: an on-chip microlens configured to collect light passing through the photographic lens; a photoelectric conversion element configured to receive the light passing through the on-chip microlens; and an internal microlens disposed between the on-chip microlens and the photoelectric conversion element and have an entrance lens on an upstream side of an optical path and an exit lens on a downstream side of the optical path, the photographic element is configured such that an optical axis of the entrance lens of the internal microlens matches an optical axis of the exit lens, and the phase difference detection element is configured such that the optical axis of the entrance lens of the internal microlens is shifted from the optical axis of the exit lens.

17. The imaging device according to claim 16, wherein both the photographic element and the phase difference detection element are configured such that the optical axis of the exit lens of the internal microlens matches the optical axis of the photoelectric conversion element.

18. An electronic camera comprising:

the imaging device according to claim 16;

a focus detection device configured to perform focus detection of the photographic lens based on pixel information read from the phase difference detection element;

a focusing control device configured to perform focusing of the photographic lens based on a focus detection result of the focus detection device; and an image data generation device configured to generate photographic image data based on pixel information read from the photographic element.

* * * * *